United States Patent [19]

Inoue et al.

[11] Patent Number: 5,300,825
[45] Date of Patent: Apr. 5, 1994

[54] PEAK SIGNAL DETECTING DEVICE

[75] Inventors: Yoshiji Inoue; Takehiko Umeyama, both of Itami, Japan

[73] Assignees: Mitsubishi Electric Engineering Company Limited; Mitsubishi Denki Kabushiki Kaisha, both of Tokyo, Japan

[21] Appl. No.: 933,713

[22] Filed: Aug. 24, 1992

[30] Foreign Application Priority Data

Aug. 30, 1991 [JP] Japan .................. 3-220012

[51] Int. Cl.[5] .................................. H03K 5/153
[52] U.S. Cl. ............................ 307/351; 307/354; 307/358
[58] Field of Search ............... 307/351, 354, 358, 360

[56] References Cited

U.S. PATENT DOCUMENTS

| | | | |
|---|---|---|---|
| 3,760,282 | 9/1973 | Arnold et al. | 307/351 |
| 3,767,938 | 10/1973 | Kueper | 307/354 |
| 4,122,397 | 10/1978 | Thomas | 307/351 |
| 4,780,623 | 10/1988 | Yagi | 307/351 |
| 5,118,967 | 6/1992 | Muth | 307/354 |
| 5,159,340 | 10/1992 | Smith | 307/351 |

FOREIGN PATENT DOCUMENTS 60-28460 7/1985 Japan .
2-9009 1/1990 Japan .

*Primary Examiner*—John T. Kwon
*Attorney, Agent, or Firm*—Oblon, Spivak, McClelland, Maier & Neustadt

[57] ABSTRACT

This invention provides a peak signal detecting device by which a peak of an input signal can be accurately detected even if a noise is caused. A level slice circuit (3) outputs a level slice signal S3 which turns to High/Low depending upon whether an absolute value of a reading signal S0 is more/less than a threshold value VT1. A level slice circuit (5) outputs a level slice signal S5 which turns to High/Low depending upon whether an absolute value of a differentiated signal S1 is more/less than a threshold value VT2. A delay circuit (6) delays a leading edge of the level slice signal S5 for a period T1 and its trailing edge for a period T2 to produce a delay signal S6. At this time, this process is cancelled when the High level of the level slice signal S5 is less than T1. A gate circuit (4) outputs a conjunction of a zero cross signal S2, level slice signal S3 and delay signal S6 as a gate signal S4' (peak detecting signal).

10 Claims, 7 Drawing Sheets

PEAK SIGNAL DETECTING DEVICE

BACKGROUND OF THE INVENTION

1. Field of the Invention

The present invention relates to a peak signal detecting device for detecting a peak of an input signal.

2. Description of the Prior Art

FIG. 8 is a block diagram showing a system architecture of a conventional peak signal detecting device for detecting a peak of an input signal, such as a magnetic disc reading signal and the like. FIG. 9 is a waveform diagram showing various signals in the peak signal detecting device. As shown in FIG. 8, a reading signal S0 (see FIG. 9) is applied through an input terminal 7 to a differentiating circuit 1 and level slice circuit 3.

The differentiating circuit 1 differentiates the reading signal S0 to output a differentiated signal S1 (see FIG. 9) to a zero cross detecting circuit 2. The zero cross detecting circuit 2 takes in the differentiated signal S1, and when detecting a time when the differentiated signal S1 reaches a zero level (a time when it crosses the zero level) ordinarily at Low level, that is, a time when an inclination of the reading signal S0 becomes 0, it outputs a zero cross signal S2 (see FIG. 9) which becomes a pulse at High level for a specific period of time, to the gate circuit 4.

On the other hand, the level slice circuit 3 outputs a level slice signal S3 (see FIG. 9) which turns to High/Low depending upon whether an absolute value of the reading signal S0 is more/less than a specified threshold value VT1, to the gate circuit 4.

The gate circuit 4 receives the zero cross signal S2 and level slice signal S3 to output a gate signal S4 (see FIG. 9) which is a conjunction of the signals S2 and S3 through an output terminal 8 to the outside. Thus, the gate signal S4 reaches the High level when the differentiated signal S1 is 0 and the absolute value of the reading signal S0 is eual to or more than VT1, while the gate signal S4 is at the Low level at a time when the reading signal S0 is near zero level with an inclination 0. As a result, the gate signal S4 reaches the High level in correspondence with a time when the reading signal S0 reaches its peak, and hence, detecting the High level of the gate signal S4 allows the peak of the reading signal S0 to be detected.

However, in the conventional peak signal detecting device, when, as shown at a time t1 in FIG. 10, a noise NZ is caused at a level over the threshold value VT1 of the level slicing circuit 3 and a false extreme point is generated in the reading signal S0, the zero cross signal S2 turns to the High level while the level slice signal S3 also turns to the High level, and the gate signal S4 turns to the High level. Hence, a generating point of the noise NZ may be erroneously detected as a time of the peak, and thus, there arises the problem that an accuracy in detecting a peak time is degraded.

SUMMARY OF THE INVENTION

According to the present invention, a peak signal detecting device includes differentiating means for receiving and differentiating an input signal to output a differentiated signal; first level slicing means for receiving the input signal and comparing an absolute value of the input signal with a first reference level, for outputting a first level slice signal which turns to a first logic level when the absolute value of the input signal is larger than the first reference level but turns to a second logic level when the former is smaller than the latter; second level slicing means for receiving the differentiated signal and comparing an absolute value of the differentiated signal with a second reference level, to output a second level slice signal which turns to a first logic level when the absolute value of the differentiated signal is larger than the second reference level but turns to a second logic level when the former is smaller than the latter; zero cross detecting means for receiving the differentiated signal and detecting a time when the differentiated signal reaches a zero level, to output a zero cross signal; delay means for receiving the second level slice signal to output a delay signal which is the second level slice signal delayed for a first period of time, the delay means having a function to cancel the first logic level when a period of the first logic level of the second level slice signal is equal to or less than a predetermined valid period; and peak detecting means for outputting a peak detecting signal indicating a peak of the input signal in accordance with the first level slice signal, zero cross signal and delay signal.

Preferably, the input signal is a magnetic disc reading signal.

Further, preferably, the first period in the delay means and the predetermined valid period are identical in length.

Preferably, the delay means includes a leading edge delay means for delaying for the first period a transition in an edge of the second level slice signal from the second logic level to the first logic level; and a trailing edge delay means for delaying for the second period a transition in an edge of the second level slice signal from the first logic level to the second logic level.

Preferably, the delay means includes a first PNP bipolar transistor where its base receives a reversed signal of the second level slice signal and the first logic level is applied to its collector; a first resistance where its one end is connected to an emitter of the first PNP bipolar transistor and the second logic level is applied to the other end; a first capacitor where its one end is connected to the emitter of the first PNP bipolar transistor and the second logic level is applied to the other end; and a first inverter having an input part connected to the emitter of the first PNP bipolar transistor, while the trailing edge delay means includes a second PNP bipolar transistor where its base receives output of the first inverter and the first logic level is applied to its collector; a second resistance where its one end is connected to an emitter of the second PNP transistor and the second logic level is applied to the other end; a second capacitor where its one end is connected to the emitter of the second PNP bipolar transistor and the second logic level is applied to the other end; and a second inverter where its input part is connected to the emitter of the second PNP bipolar transistor and its output signal serves as the delay signal.

Preferably, the first level slice means includes a first comparator where its positive input receives the input signal while its negative input receives the first reference level, the input signal and the first reference level are compared, and a first comparison result is outputted which turns to a first logic level when the input signal is larger than the first reference level but turns to a second logic level when the former is smaller than the latter; a second comparator where its positive input receives a reversed signal of the input signal while its negative input receives the first reference level, the reversed signal of the input signal and the first reference level are compared, and a second comparison result is outputted which turns to a first logic level when the reversed signal of the input signal is larger than the first reference level but turns to a second logic level when the former is smaller than the latter; and an OR gate for receiving the first and second comparison results to output a disjunction of the first and second comparison results as the first level slice signal.

Preferably, the second level slice means includes a first comparator where its positive input receives the differentiated signal while its negative input receives the second reference level, the differentiated signal and the second reference level are compared, and a second comparison result is outputted which turns to a first logic level when the differentiated signal is larger than the second reference level but turns to a second logic level when the former is smaller than the latter; a second comparator where its positive input receives a reversed signal of the differentiated signal while its negative input receives the second reference level, the reversed signal of the differentiated signal and the second reference level are compared, and a second comparison result is outputted which turns to a first logic level when the reversed signal of the differentiated signal is larger than the second reference level but turns to a second logic level when the former is smaller than the latter; and an OR gate for receiving the first and second comparison results to output a disjunction of the first and second comparison results as the first level slice signal.

Preferably, the zero cross means includes a delay part for receiving the differentiated signal and delaying the differentiated signal for a predetermined period of time to output a delay differentiated signal; and an exclusive OR gate for receiving the differentiated signal and the delay differentiated signal to output an exclusive disjunction of the differentiated signal and the delay differentiated signal as the zero cross signal.

Preferably, the delay means includes a time constant circuit for receiving the second level slice signal and blunting a transition in an edge of the second level slice signal between the first and second logic levels with a specified time constant to output a blunted second level slice signal; and a buffer for receiving the blunted second level slice signal to output the second logic level when the blunted second level slice signal reaches to a side on the second logic level rather than a first threshold value at a time of the transition in an edge of the blunted second level slice signal from the first logic level to the second logic level, or output the first logic level when the blunted second level slice signal reaches a side on the first logic level rather than a second threshold value at a time of the transition in the edge of the blunted second level slice signal form the second logic level to the first logic level; the second threshold value of the buffer being set on the side of the first logic level rather than the first threshold value.

Preferably, the delay means includes a first delay circuit for receiving the second level slice signal and delaying the second level slice signal for the identical period to the predetermined valid period to output a first delay level slice signal; a second delay circuit for receiving the second level slice signal and delaying the second level slice signal for a sufficiently longer predetermined period than the predetermined valid period to output a second delay level slice signal; an AND gate for receiving the second level slice signal and first delay level slice signal to output an AND signal as a conjunction of the second level slice signal and first delay level slice signal; and a D flip flop where the first logic level is applied to its D input, its toggle input receives the AND signal, its reset input receives the second delay level slice signal and its Q output serves as the delay signal.

Accordingly, it is an object of the present invention to provide a peak signal detecting device by which a peak time of an input signal can be accurately detected even if a noise is caused.

These and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 1:
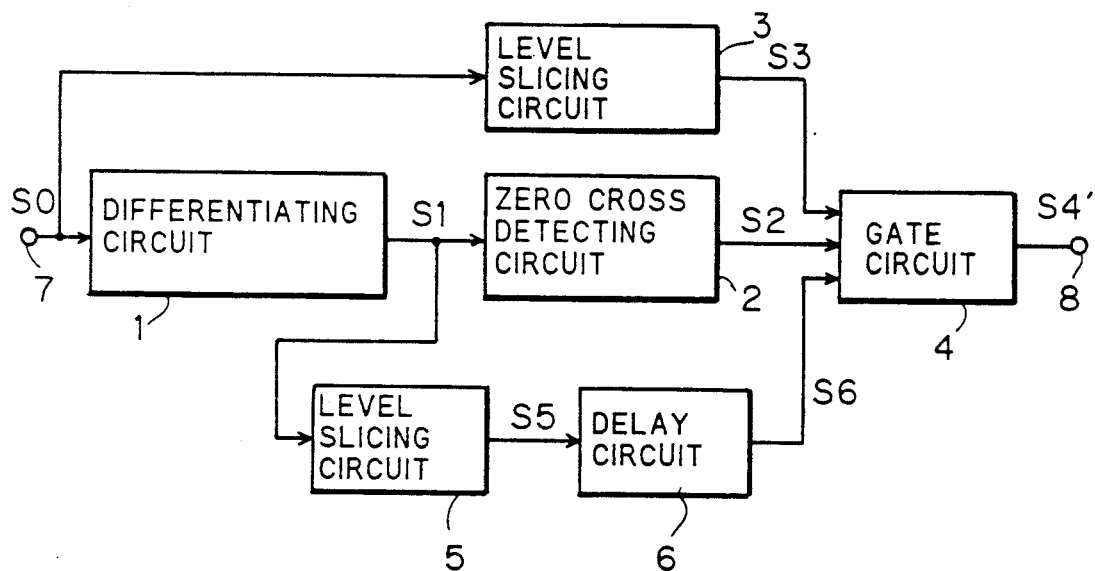
FIG. 1 is a block diagram showing a system architecture of a peak signal detecting device of an embodiment according to the present invention.
Figure 2:
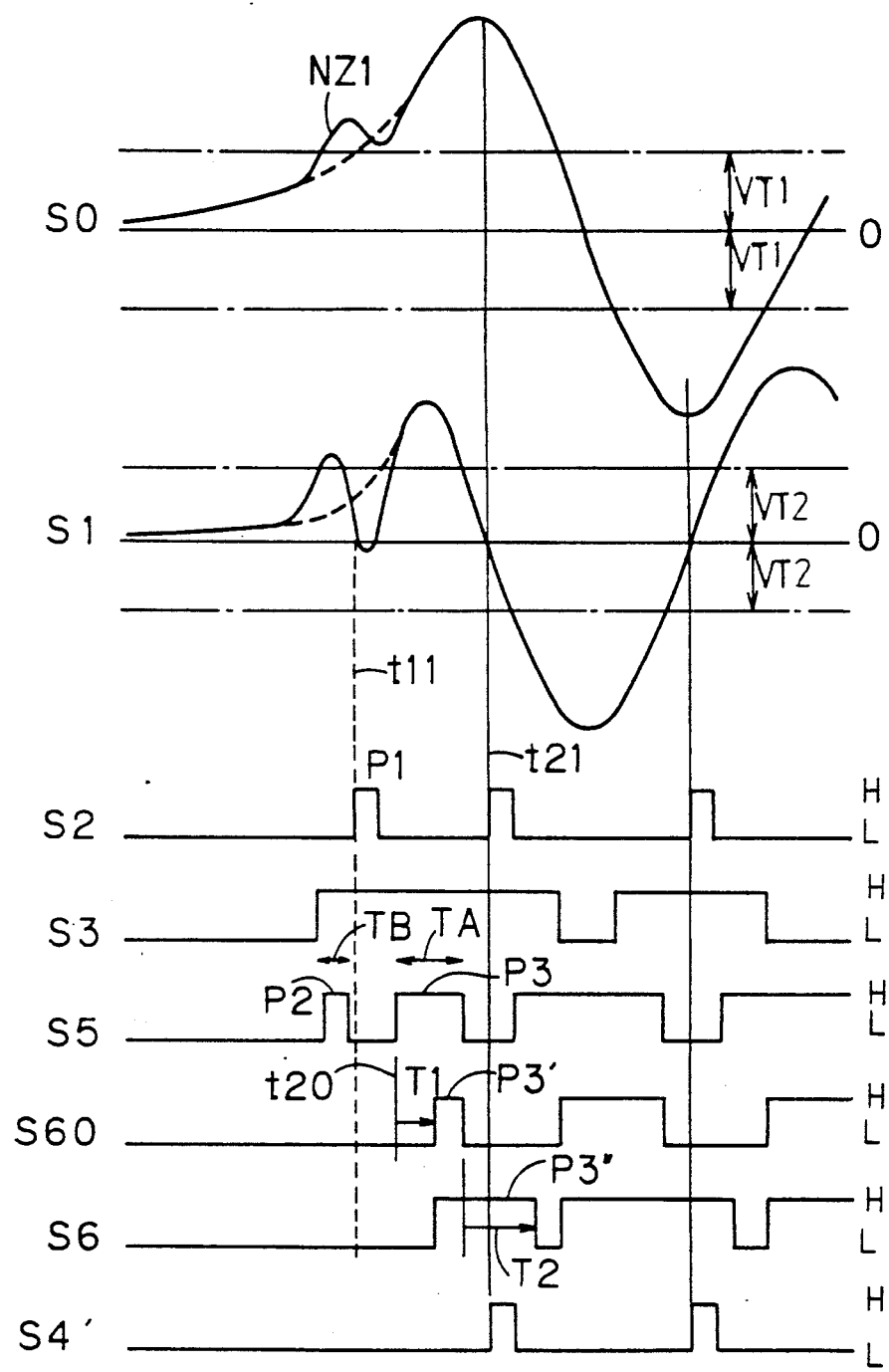
FIG. 2 is a waveform diagram showing the operation of the peak signal detecting device shown in FIG. 1.

FIG. 1 is a block diagram showing a system architecture of a peak signal detecting device of an embodiment according to the present invention. FIG. 2 is a waveform diagram showing various signals of the peak signal detecting device shown in FIG. 1. As shown in FIG. 1, a magnetic disc reading signal S0 (see FIG. 2) is applied through an input terminal 7 to a differentiating circuit 1 and level slicing circuit 3.

The differentiating circuit 1 differentiates the reading signal S0 to output a differentiated signal S1 (see FIG. 2) to a zero cross detecting circuit 2 and level slicing circuit 5. The zero cross detecting circuit 2 takes in the differentiated signal S1, and when it detects a point when the differentiated signal S1 reaches the level zero, that is, a point when an inclination of the reading signal S0 becomes 0, the zero cross detecting circuit 2 outputs a zero cross signal S2 (see FIG. 2) which becomes a pulse at High level for a specified period, to a gate circuit 4.

Then, the level slicing circuit 3 outputs a level slice signal S3 (see FIG. 2) which turns to High/Low depending upon whether an absolute value of the reading signal S0 is more/less than a predetermined threshold value VT1, to the gate circuit 4.

On the other hand, a level slicing circuit 5 outputs a level slicing signal S5 (see FIG. 2) which turns to High/Low depending upon whether an absolute value of the differentiated signal S1 is more/less than a predetermined threshold value VT2, to a delay circuit 6.

The delay circuit 6 produces inside an inner signal S60 (see FIG. 2, not shown in FIG. 1) which has a period T1 delay of each leading edge alone of the level slicing signal S5, and then it also produces a delay signal S6 which has a period T2 delay of each trailing edge alone of the inner signal S60.

The gate circuit 4 receives the zero cross signal S2, level slice signal S3, and delay signal S6 to output a gate signal S4' (see FIG. 2) which is a conjunction of the three signals S2, S3 and S6 through an output terminal 8 to the outside.

Now, with reference to FIG. 2, the operation of the peak signal detecting device according to this embodiment will be described. As shown in FIG. 2, similar to the conventional embodiments, the zero cross signal S2 and level slice signal S3 reach the High level at time t21 when the reading signal SO reaches its peak.

On the other hand, the differentiated signal S1 is over the threshold value VT2 for a period TA (>T1) previous to the time t21. Specifically, the threshold VT2 and period T1 should be set so that the period TA, which is longer than the T1 and for which an inclination of the differentiated signal S1 is over VT2, can necessarily exist before the time t21 when the reading signal SO reaches its peak and its inclination becomes 0. Thus, the level slice signal S5 generates a High level pulse (P3) having a pulse width of TA at a time t20 prior to the time t21.

Since the pulse width TA of the High level pulse P3 of the level slice signal S5 is TA>T1, a High level pulse P3' still remains in the inner signal S60 even if a leading edge of the H level pulse P3 is delayed for the period T1 by the delay circuit 5. Then, with a delay of a trailing edge of the inner signal S60 for a period T2, the delay signal S6 is produced by the delay circuit 6, which has a High level pulse P3" rising at a time (t20+T1) with a pulse width (TA+T2−T1). At this time, the delay period T2 of the trailing edge which is set sufficiently long allows the delay signal S6 to certainly attain the High level at this time t21. Thus, in most cases, T2>T1 is satisfied.

As a result, when the zero cross signal S2, level slice signal S3 and delay signal S6 all reach the H level at the time t21, a gate signal S4' turns to High, and thus, a peak of the reading signal SO can be detected.

Also, assuming that a noise NZ1 is generated in the reading signal SO at a level over the threshold VT1 at a time t11, as conventional, the zero cross signal S2 and level slice signal S3 turn to High.

For a period TB (<T1) prior to the time t11, the differentiated signal S1 is over the threshold value VT2. Specifically, there exists a period TB during which the inclination of the differentiated signal S1 is over VT2 prior to the time t11 when the reading signal SO reaches its noise peak and its inclination becomes 0. Thus, at the time t10 prior to the time t11, the level slice signal S5 generates a High level pulse (P2) with a pulse width of TB. In many cases, however, the period TB is not so long because the pulse P2 is a noise, and therefore, setting the T1 appropriately can follow TB<T1 in most cases.

In this way, since the pulse width TB of the H level pulse P2 of the level slice signal S5 is TB<T1, the H level pulse P2 is cancelled when a leading edge of the H level pulse 2 of the level slice signal S5 is delayed for the period T1 by the delay circuit 6. Because of this, there appears no H level pulse in the inner signal S60 in correspondence with the H level pulse P2 of the level slice signal S5. Thus, also, there appears no H level pulse in the delay signal S6 in correspondence with the H level pulse P2 at all.

As a result, even if the zero cross signal S2 and level slice signal S3 turn to the High level at the time t11, the delay signal S6 accordingly turning to the Low level causes the gate signal S4' to turn to the Low level, and therefore, there is no possibility that a false extreme point caused by the noise NZ1 of the reading signal SO is detected erroneously for its peak. Thus, in spite of an influence of the noise, the peak of the reading signal SO can be always detected with accuracy.

Accordingly, even if a track signal adjacent on a disc or an error of the disc exerts an influence on a reading signal received from the disc to change its waveform (make a noise) and causes a false extreme point, there is no possibility that the false extreme point is detected erroneously as a peak of the reading signal, and consequently, the peak of the reading signal can be detected with high accuracy even with the disc of high density.

Figure 3:
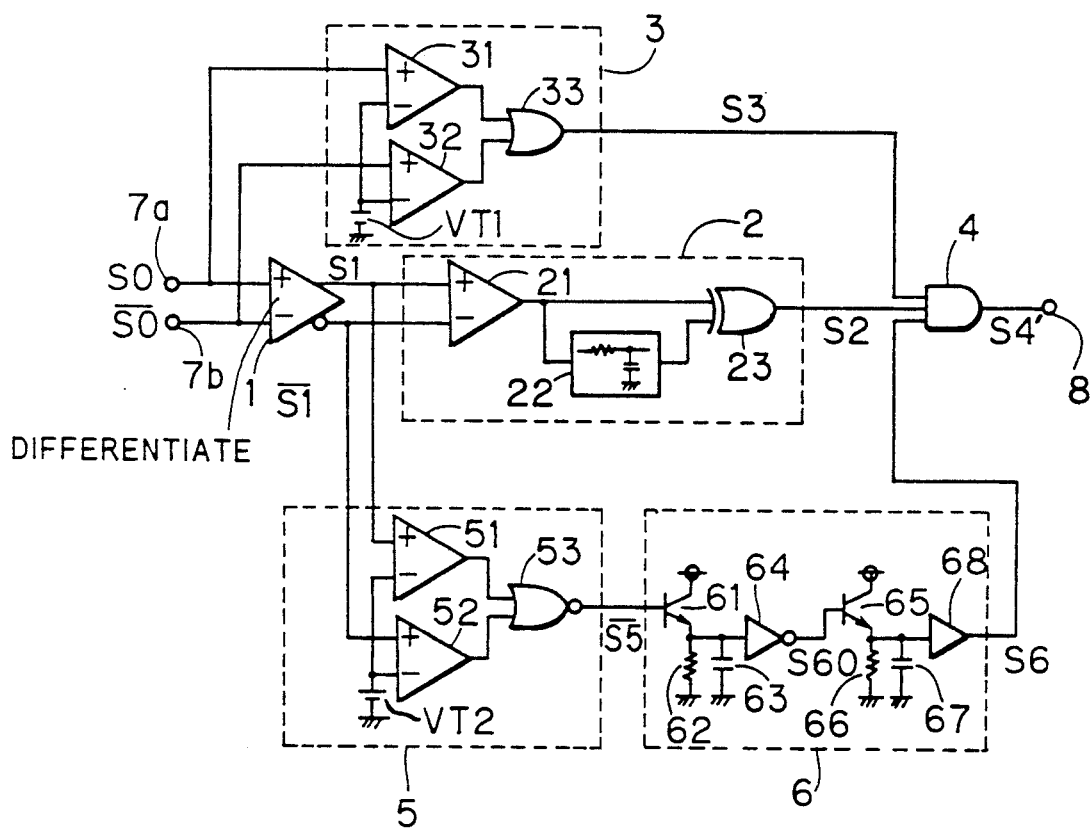
FIG. 3 is a circuit diagram showing the peak signal detecting device shown in FIG. 1 in detail.

FIG. 3 is a circuit diagram showing in detail the peak signal detecting device of FIG. 1. As shown in FIG. 3, the reading signal SO and an image reading reversed signal $\overline{SO}$ are taken in positive and negative inputs of the differentiating circuit 1.

The differentiating circuit 1 differentiates the reading signal SO to output the differentiated signal S1 and a reversed differentiated signal $\overline{S1}$. The zero cross circuit 2 has a comparator 21, which takes the differentiated signal S1 and the reversed differentiated signal $\overline{S1}$ in its positive and negative inputs and then applies an output signal to one of inputs of a delay circuit 22 and exclusive OR gate 23 while the delay gate 22 applies an output signal to the other input of the exclusive OR gate 23. Then, an output signal of the exclusive OR gate 23 serves as the zero cross signal S2.

In the zero cross circuit 2 structured as mentioned above, the output of the exclusive OR gate 23 turns to High for a period delayed by the delay circuit 22 from a point when the output of the comparator 21 turns High to Low or Low to High, that is, from a point when the differentiated signal S1 crosses the level zero.

The level slicing circuit 3 is comprised of comparators 31 and 32 and an OR gate 33, and while taking the reading signal SO and a reference voltage VT1 in positive and negative inputs of the comparator 31, the level slicing circuit 3 takes the reading reversed signal $\overline{SO}$ and a reference voltage VT1 in positive and negative inputs of the comparator 32. Output signals of the comparators 31 and 32 are applied to separate inputs of the OR gate 33. Output of the OR gate 33 serves as the level slice signal S3.

In the level slicing circuit 3 structured as mentioned above, the output of the comparator 31 turns to the High level when the reading signal SO is over the threshold VT1 while the output of the comparator 32 turns to the High level when the reading reversed signal $\overline{SO}$ is over the threshold value VT1 (i.e., when the reading signal SO is under the threshold value −VT1), and hence, the level slice signal S3 which is the output of the OR gate 33 turns to High/Low depending upon whether the absolute value of the reading signal SO is more/less than the threshold value VT1.

The level slice circuit 5 is comprised of comparators 51 and 52 and a NOR gate 53, and while taking the differentiated signal S1 and reference voltage VT2 in positive and negative inputs of the comparator 51, the level slicing circuit 5 takes the reversed differentiated signal $\overline{S1}$ and reverence voltage VT2 in positive and negative inputs of the comparator 52. Outputs of the comparators 51 and 52 are one of inputs and the other of the NOR gate 53, respectively. Output of the NOR gate 53 serves as a reversed level slice signal $\overline{S5}$.

In the level slicing circuit 5 structured in this manner, output of the comparator 51 turns to the High level when the differentiated signal S1 is over the threshold value VT2 while output of the comparator 52 turns to the High level when the reversed differentiated signal $\overline{S1}$ is over the threshold value VT2 (i.e., the differentiate signal S1 is under the threshold value −VT2), and hence, the reversed level slice signal $\overline{S5}$ which is an output of the NOR gate 53 turns to Low/High depending upon whether the absolute value of the differentiated signal S1 is more/less than the threshold value VT2.

The delay circuit 6 is comprised of NPN transistors 61 and 65, resistances 62 and 66, capacitors 63 and 67, an inverter 64 and a buffer 68. The NPN transistor 61 where the reversed level slice signal $\overline{S5}$ is applied to its base has a collector connected to a supply voltage $V_{CC}$ and has an emitter connected to one end of the resistance 62, one electrode of the capacitor 63 and an input of the inverter 64. Then, the other end of the resistance 62 and the other electrode of the capacitor 63 are commonly grounded. Output of the inverter 64 serves as the leading edge delay signal S60.

The leading edge delay signal S60 is applied to the base of the NPN transistor 65, which in turn has a collector connected to the supply voltage $V_{CC}$ and an emitter connected to one end of the resistance 66, one electrode of the capacitor 67 and an input of the buffer 68. The other end of the resistance 66 and the other electrode of the capacitor 67 are commonly grounded. Then, output of the buffer 68 serves as the delay signal S6 of the delay circuit 6.

In the delay circuit 6 structured in this manner, since usually the reversed level slice signal $\overline{S5}$ is at the High level, as the NPN transistor 61 turns on while the capacitor 63 is charged, a potential at the emitter of the NPN transistor 61 turns to the High level. Thus, output of the inverter 64 serving as the leading edge delay signal S60 is at the Low level.

When the reversed level slice signal $\overline{S5}$ turns to the Low level, as the NPN transistor 61 turns off while the capacitor 63 is discharged, the potential at the emitter of the NPN transistor 61 is reduced. At this time, a capacity value of the capacitor 63 appropriately set prevents the potential of the emitter of the NPN transistor 61 from being under the threshold of the inverter 64 when the NPN transistor turns off for a period equal to or less than T1. Thus, when a period during which the level slice signal S5 stays at the High Level is T1 or less, the inner signal S60 does not change from the Low level, and it is not reversed from the Low level to the High level until the level slice signal S5 stays at the High level for a period equal to or more than T1. Consequently, a delay of the leading edge of the level slice signal S5 for the period T1 is realized.

On the other hand, as stated above, the inner signal S60 is usually at the Low level, and as the NPN transistor 65 turns off while the capacitor 67 is discharged, the potential at the emitter of the transistor 65 decreases to the Low level. Thus, output of the buffer 68 serving as the delay signal S6 is usually at the Low level.

When the inner signal S60 reaches the High level, as the NPN transistor 65 turns on while the capacitor 67 is discharged, the potential at the emitter of the NPN transistor 65 instantaneously rises to the High level. After that, when the inner signal S60 falls from High to Low, the potential at the emitter of the NPN transistor 65 is reduced as the NPN transistor 65 turns off while the capacitor 67 is discharged. At this time, a capacity value of the capacitor 67 adequately set does not allow the potential at the emitter of the NPN transistor 65 to be under the threshold voltage of the buffer 68 until the inner signal S60 stays at the Low level for a period equal to or more than T2. In this way, a delay of a trailing edge of the inner signal S60 for the period T2 is realized.

Thus structured, the delay circuit 6 can produce the inner signal S60 which is the level slice signal S5 having the leading edge delayed for the period T1, and output the delay signal S6 which is the inner signal S60 having its trailing edge delayed for the period T2.

The AND gate (gate circuit) 4 receives the zero cross signal S2, level slice signal S3 and delay signal S6 to output a conjunction as a gate signal S4' from the output terminal 8.

Figure 4:
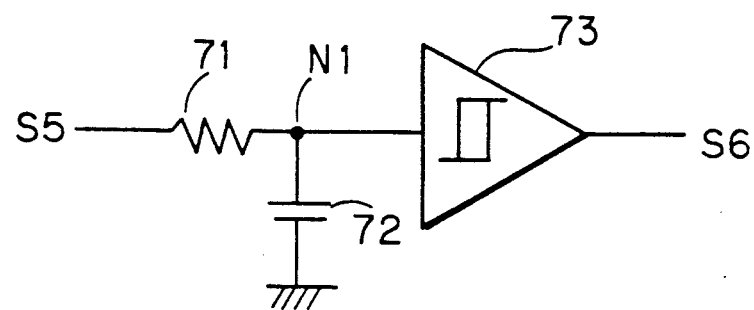
FIG. 4 is a circuit diagram showing a second architecture of a delay circuit shown in FIG. 1.

FIG. 4 is a circuit diagram showing a second architecture of the delay circuit 6. As shown in FIG. 4, the delay circuit 6 is comprised of a resistance 71, a capacitor 72 and a buffer 73 having hysteresis.

The level slice signal S5 is applied through the resistance 71 to an input of the buffer 73 with hysteresis. The capacitor 72 is interposed between a node N1 or an input of the buffer 73 with hysteresis and a ground level. The buffer 73 with hysteresis is set so as to have a higher Low to High threshold value VH than a High to Low threshold value VL.

In the delay circuit 6 structure in this manner, when the level slice signal S5 rises Low to High, a potential at the node N1 gently rises from the ground level with an RC time constant determined by the resistance 71 and capacitor 72. At this time, setting a resistance value of the resistance 71, a capacity value of the capacitor 72, and the threshold value VH appropriately, the period from a time when the level slice signal S5 rises Low to High to a time when the potential at the Node N1 reaches the threshold value VH is defined to T1, as shown in FIG. 5.

Figure 5:
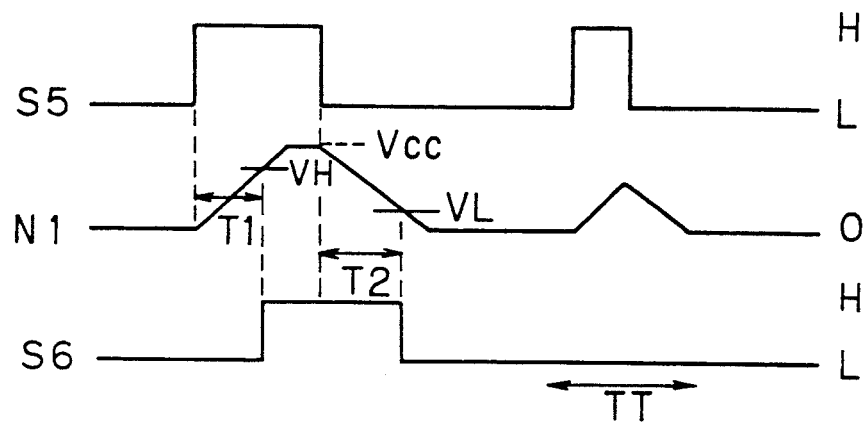
FIG. 5 is a waveform diagram showing the operation of the delay circuit shown in FIG. 4.

Thus, the delay signal S6 which is an output signal of the buffer 73 with hysteresis does not reach the High level until a period during which the level slice signal S5 stays at the High level is not equal to or over T1, but there appears no High level in the delay signal S6 when the period during which the level slice signal S5 stays at the High level is equal to or less than T1 (see a period TT in FIG. 5).

When the level slice signal S5 falls High to Low, the potential at the node N1 gently falls from a level of the supply voltage $V_{CC}$ with the RC time constant determined by the resistance 71 and the capacitor 72. At this time, setting a resistance value of the resistance 71, a capacity value of the capacitor 72, and the threshold value VL appropriately, the period from a time when the level slice signal S5 falls High to Low to a time when the potential at the Node N1 reaches the threshold value VL is defined to T2, as shown in FIG. 5.

Accordingly, delaying the trailing edge of the level slice signal S5 for the period T2, the delay signal S6 which is an output of the buffer 73 with hysteresis appears.

The delay circuit 6 structured in this manner can output the delay signal S6 which is the level slice signal S5 having a leading edge delayed for the period T1 and a trailing edge delayed for the period T2.

Figure 6:
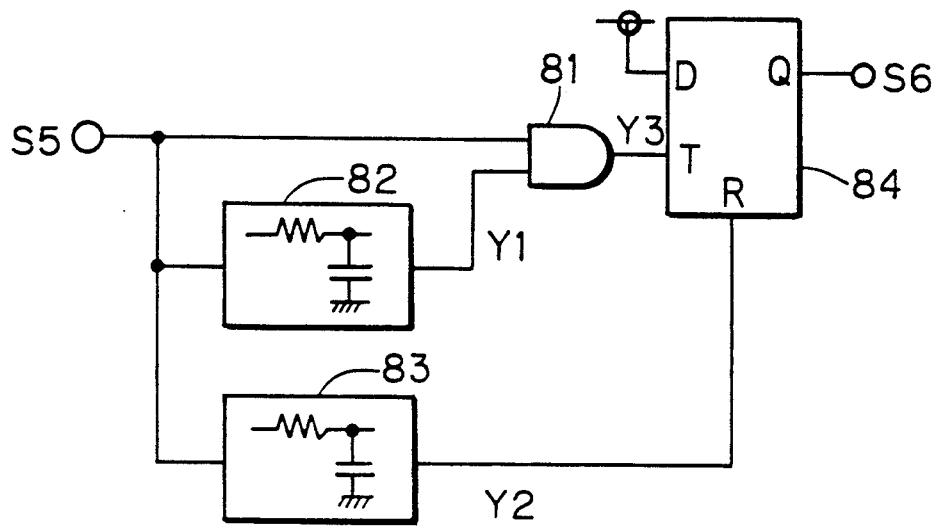
FIG. 6 is a circuit diagram showing a third architecture of the delay circuit shown in FIG. 1.

FIG. 6 is a circuit diagram showing a third architecture of the delay circuit 6. As shown in FIG. 6, the delay circuit 6 is comprised of an AND gate 81, delay units 82 and 83, and a D flip flop 84. The level slice signal S5 is applied to one input of the AND gate 81 and the delay units 82 and 83. The delay unit 82 applies an output signal Y1 which is the level slice signal S5 delayed for the period T1 to the other input of the AND gate 81. The delay unit 83 applies an output signal Y2 which is the level slice signal S5 delayed for a period TD to a reset input R of the D flip flop 84. Moreover, an output signal Y3 of the AND gate 83 is applied to a toggle input T of the D flip flop 84. The D flip flop 84 has a D input connected to the supply voltage $V_{CC}$ appears and outputs a Q output serving as the delay signal S6.

Figure 7:
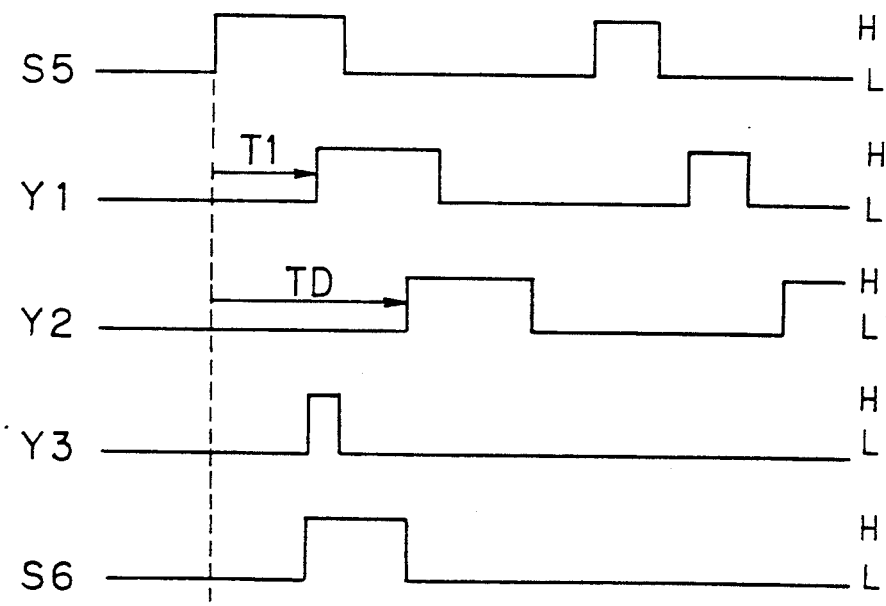
FIG. 7 is a waveform diagram showing the operation of the delay circuit shown in FIG. 6.
Figure 8:
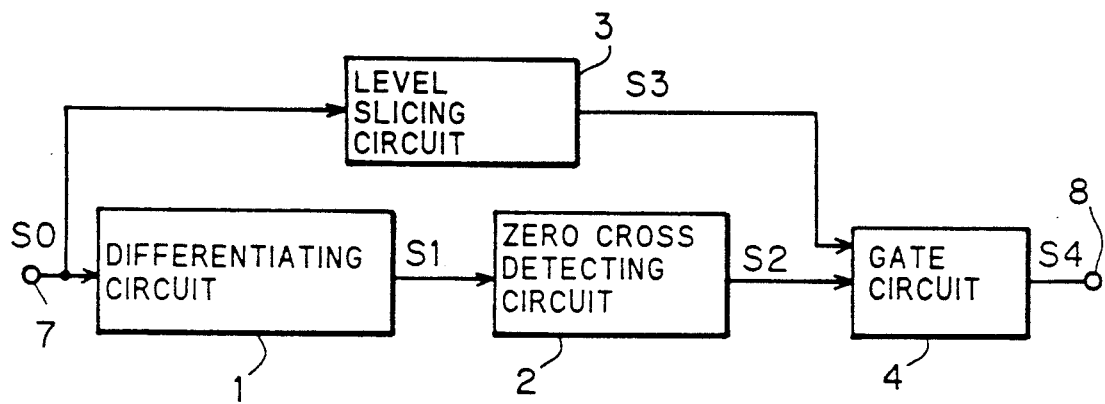
FIG. 8 is a block diagram showing an architecture of a conventional peak signal detecting device.
Figure 9:
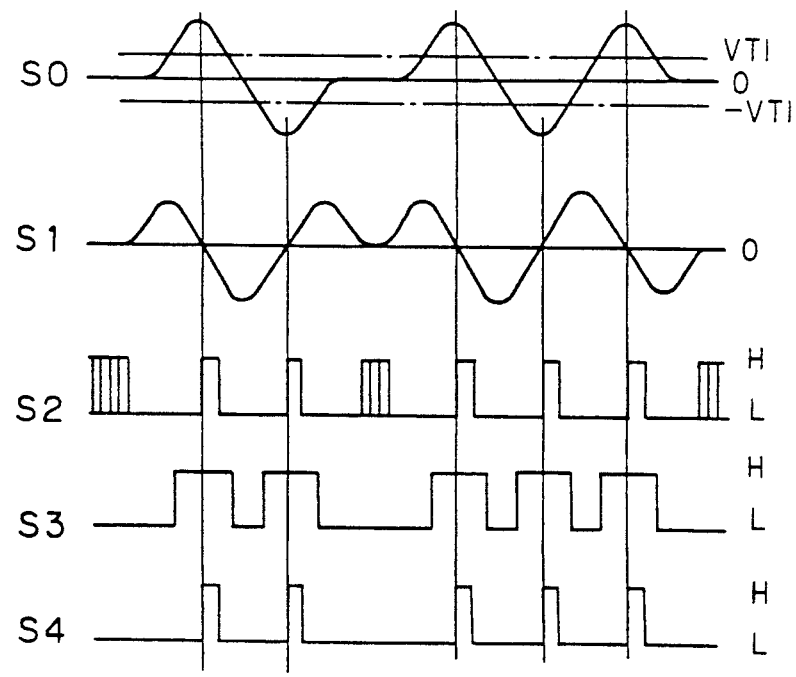
FIG. 9 is a waveform diagram showing the operation of the peak signal detecting device shown in FIG. 8.
Figure 10:
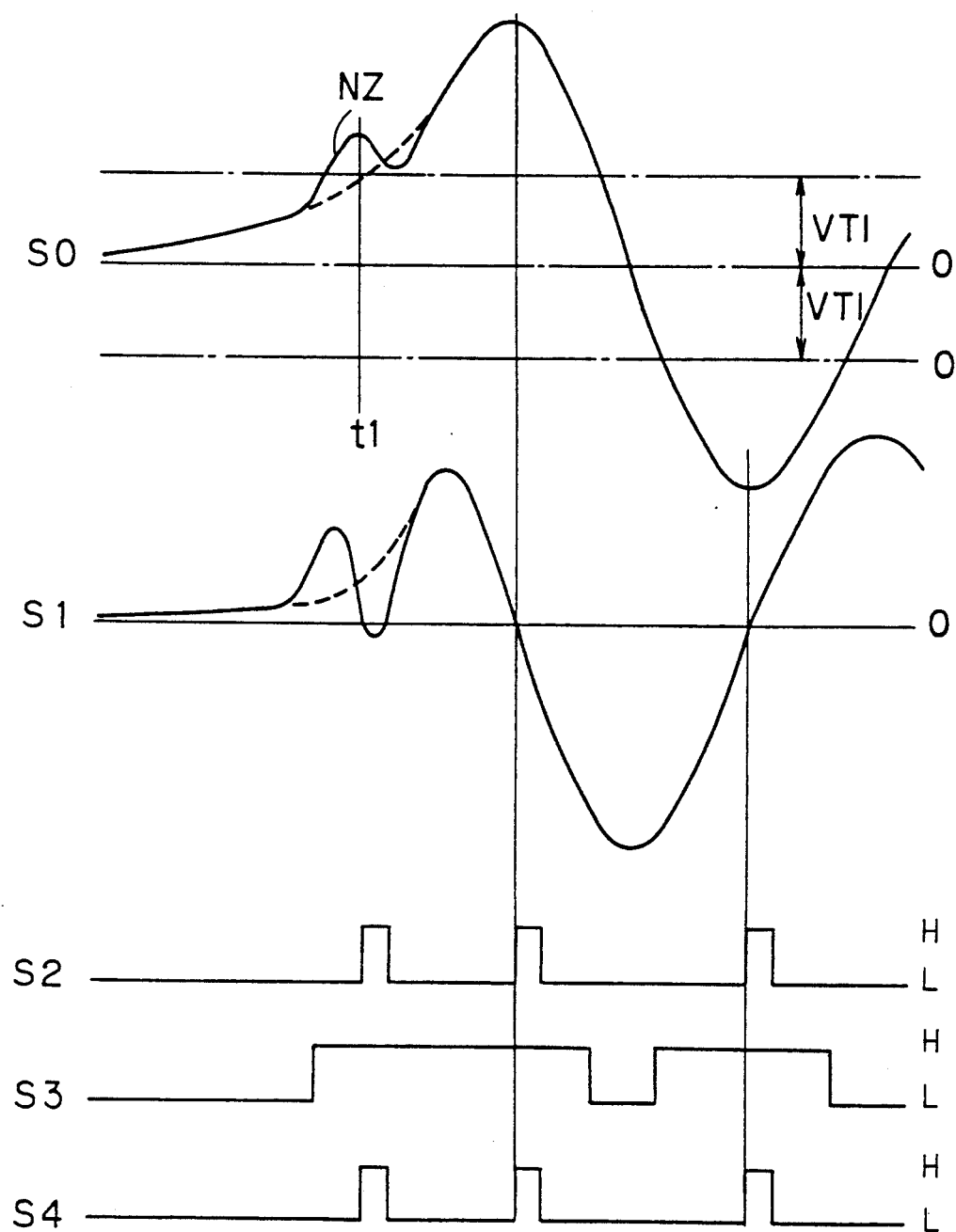
FIG. 10 is a waveform diagram indicating drawbacks of the conventional peak signal detecting device.

FIG. 7 is a waveform diagram showing the operation of the delay circuit 6 shown in FIG. 6. Now, the delay operation of the delay circuit 6 shown in FIG. 6 will be explained with reference to FIG. 7.

First, the level slice signal S5 rises Low to High, and then, the output signal Y1 of the delay unit 82 also rises Low to High after the delay period T1 elapses in the delay unit 82. This is not until the output signal Y3 of the AND gate 81 rises Low to High to toggle the D flip flop 84, of which Q output, or the delay signal S6, then reaches the High level.

Thus, while the delay signal S6 which is the Q output of the D flip flop does not reach the High level until the level slice signal S5 stays at the High level for a period equal to or more than T1, there appears no High level in the delay signal S6 when the level slice signal S5 stays at the High level for a period equal to or less than T1.

The level slice signal S5 rises Low to High, and then, after a delay time TD elapses in the delay unit 83, the output signal Y2 of the delay unit 83 rises Low to High. Hence, a reset input R of the D flip flop turns to High to reset it, and its Q output, or the delay signal S6, reaches the Low level.

Thus, setting the delay time TD of the delay unit 83 sufficiently long, a signal which is the level slice signal S5 having its trailing edge delayed can appear as the Q output of the D flip flop 84, or the delay signal S6.

The delay circuit 6 structured in this manner can output the delay signal S6 which is the level slice signal S5 having its leading edge delayed for the time T1 and its trailing edge delayed for a predetermined period or over.

Although the slice signal S5 has its leading edge delayed for the period T1 and its trailing edge delayed for the period T2 to output the delay signal S6, it is not intended that the practice be limited to this precisely. One necessary thing is that the High level of the level slice signal S5 can be cancelled when the period during which the level slice signal S5 stays at the High level for a period equal to or less than T1, and that the High level of the delay signal S6 certainly appears at the peak of the reading signal S0 when the High level of the level slice signal S5 is valid.

As previously mentioned, according to the peak signal detecting device described in claim 1, delay means outputs a delay signal which is a second level slice signal delayed for a first period, and also the delay means cancels a first logic level of the second level slice signal when the first logic level is equal to or less than a predetermined valid period.

Thus, when an input signal has a false extreme point due to an influence of a noise, it is possible to prevent the first logic level from appearing in the delay signal output from the delay means. In addition to that, setting the first period appropriately, the first logic level of the delay signal can certainly appears at the peak of an input signal.

Also, according to the peak signal detecting device described in claim 2, the delay means has trailing edge delay means, and therefore, it is also possible that a period of the delay signal output at the first logic level is extended so that the first logic level can certainly appear in the delay signal at the peak of the input signal.

As a result, a peak signal detecting device can be obtained by which a peak of an input signal can be accurately detected even if a noise is caused.

While the invention has been shown and described in detail, the foregoing description is in all aspects illustrative and not restrictive. It is therefore understood that numerous modifications and variations can be devised without departing from the scope of the invention.

We claim:

1. A peak signal detecting device, comprising:
   differentiating means for receiving and differentiating an input signal to output a differentiated signal;
   first level slicing means for receiving said input signal and comparing an absolute value of said input signal with a first reference level, to output a first level slice signal which turns to a first logic level when the former is larger than the latter but turns to a second logic level when the former is smaller than the latter;
   second level slicing means for receiving said differentiated signal and comparing an absolute value of said differentiated signal with a second reference level, to output a second level slice signal which turns to said first logic level when the former is larger than the latter but turns to said second logic level when the former is smaller than the latter;
   zero cross detecting means for receiving said differentiated signal and detecting a time when said differentiated signal reaches a zero level, to output a zero cross signal;
   delay means for receiving said second level slice signal to output a delay signal which is said second level slice signal delayed for a first period of time, said delay means having a function to cancel said first logic level when a period of said first logic level of said second level slice signal is equal to or less than a predetermined valid period; and
   peak detecting means for outputting a peak detecting signal indicating a peak of said input signal in accordance with said first level slice signal, zero cross signal and delay signal.

2. A device according to claim 1, wherein said input signal is a magnetic disc reading signal.

3. A device according to claim 1, wherein said first period in said delay means and said predetermined valid period are identical in length.

4. A device according to claim 1, wherein said delay means includes
   a leading edge delay means for delaying for said first period a transition in an edge of said second level slice signal from said second logic level to said first logic level; and a trailing edge delay means for delaying for said second period a transition in an edge of said second level slice signal from said first logic level to said second logic level.

5. A device according to claim 4, wherein said leading edge delay means includes a first PNP bipolar transistor where its base receives a reversed signal of said second level slice signal and said first logic level is applied to its collector;

a first resistance where its one end is connected to an emitter of said first PNP bipolar transistor and said second logic level is applied to the other end;

a first capacitor where its one end is connected to said emitter of said first PNP bipolar transistor and said second logic level is applied to the other end; and a first inverter having an input part connected to said emitter of said first PNP bipolar transistor, while said trailing edge delay means includes a second PNP bipolar transistor where its base receives output of said first inverter and said first logic level is applied to its collector;

a second resistance where its one end is connected to an emitter of said second PNP transistor and said second logic level is applied to the other end;

a second capacitor where its one end is connected to to said emitter of said second PNP bipolar transistor and said second logic level is applied to its other end; and a second inverter where its input part is connected to said emitter of said second PNP bipolar transistor and its output signal serves as said delay signal.

6. A device according to claim 1, wherein said first level slice means includes a first comparator where its positive input receives said input signal while its negative input receives said first reference level, said input signal and said first reference level are compared, and a first comparison result is outputted which turns to a first logic level when said input signal is larger than said first reference level or turns to a second logic level when the former is smaller than the latter;

a second comparator where its positive input receives a reversed signal of said input signal while its negative input receives said first reference level, said reversed signal of said input signal and said first reference level are compared, and a second comparison result is outputted which turns to a first logic level when said reversed signal of said input signal is larger than said first reference level or turns to a second logic level when the formed is smaller than the latter; and an OR gate for receiving said first and second comparison results to output a disjunction of said first and second comparison results as said first level slice signal.

7. A device according to claim 1, wherein said second level slice means includes a first comparator where its positive input receives said differentiated signal while its negative input receives said second referenced level, said differentiated signal and said second reference level are compared, to a first comparison result is outputted which turns to a first logic level when said differentiated signal is larger than said second reference level or turns to a second logic level when the former is smaller than the latter;

a second comparator where its positive input receives a reversed signal of said differentiated signal while its negative input receives said second reference level, said reversed signal of said differentiated signal and said second reference level are compared, and a second comparison result is outputted which turns to a first logic level when said reversed signal of said differentiated signal is larger than said second reference level or turns to a second logic level when the former is smaller than the latter; and an OR gate for receiving said first and second comparison results to outputs a disjunction of said first and second comparison results as said first level slice signal.

8. A device according to claim 1, where said zero cross means includes a delay part for receiving said differentiated signal and delaying said differentiated signal for a predetermined period of time to output a delay differentiated signal; and an exclusive OR gate for receiving said differentiated signal and said delay differentiated signal to output an exclusive logic sum of said differentiated signal and said delay differentiated signal as said zero cross signal.

9. A device according to claim 1, wherein said delay means includes a time constant circuit for receiving said second level slice signal and blunting a transition in an edge of said second level slice signal between said first and second logic levels with a specified time constant to output a blunted second level slice signal; and a buffer for receiving said blunted second level slice signal to output said second logic level when said blunted second level slice signal reaches to a side on said second logic level rather than a first threshold value at a time of the transition in an edge of said blunted second level slice signal from said first logic level to said second logic level, or output said first logic level when said blunted second level slice signal reaches a side on said first logic level rather than a second threshold value at a time of the transition in the edge of said blunted second level slice signal form said second logic level to said first logic level;

said second threshold value of said buffer being set on the side of said first logic level rather than said first threshold value.

10. A device according to claim 1, wherein said delay means includes a first delay circuit for receiving said second level slice signal and delaying said second level slice signal for the identical period to said predetermined valid period to output a first delay level slice signal;

a second delay circuit for receiving said second level slice signal and delaying said second level slice signal for a sufficiently longer predetermined period than said predetermined valid period to output a second delay level slice signal;

an AND gate for receiving said second level slice signal and first delay level slice signal to output an AND signal as a conjunction of said second level slice signal and first delay level slice signal; and a D flip flop where said first logic level is applied to its D input, its toggle input receives said AND signal, its reset input receives said second delay level slice signal and its Q output serves as said delay signal.

* * * * *